United States Patent [19]  
Spigarelli et al.

[11] Patent Number: 4,757,780  
[45] Date of Patent: * Jul. 19, 1988

[54] APPARATUS FOR SOLDER REMOVAL

[75] Inventors: Donald J. Spigarelli, Carlisle; Douglas J. Peck, North Andover; Walter J. Hall, New Corner; James L. Finney, Hudson, all of Mass.

[73] Assignee: The HTC Corporation, Concord, Mass.

[*] Notice: The portion of the term of this patent subsequent to Sep. 17, 2002 has been disclaimed.

[21] Appl. No.: 865,232

[22] Filed: May 20, 1986

Related U.S. Application Data

[63] Continuation of Ser. No. 708,044, Mar. 4, 1985, abandoned, which is a continuation of Ser. No. 555,715, Nov. 28, 1983, Pat. No. 4,541,358.

[51] Int. Cl.$^4$ .......................... H05K 3/24; B05C 3/10  
[52] U.S. Cl. ...................................... 118/64; 118/69; 118/425; 118/429  
[58] Field of Search .................. 118/64, 69, 425, 429; 228/20, 40, 43

[56] References Cited

U.S. PATENT DOCUMENTS

| | | | |
|---|---|---|---|
| 4,315,042 | 2/1982 | Spigarelli | 118/72 X |
| 4,389,797 | 6/1983 | Spigarelli et al. | 118/58 X |
| 4,541,358 | 9/1985 | Spigarelli et al. | 118/58 |

Primary Examiner—John P. McIntosh  
Attorney, Agent, or Firm—Spencer T. Smith

[57] ABSTRACT

A vapor phase system for soldering of a workpiece. A vessel for containing an electronic liquid which is heated to generate a zone of saturated vapor. A first inclined throat communicates with the vessel and a solder pot is located within the vessel. The solder pot including a reservoir for containing molten solder, a second throat aligned with the first throat and communicating at one end with molten solder contained in the reservoir means and communicating at the other end with the saturated vapor, molten solder contained in the reservoir means is pumped through the second throat and is captured by the reservoir and a conveyor carries work product through the first throat, through the saturated vapor and into the second throat whereby the work product will become immersed in the molten solder contained within the second throat.

2 Claims, 5 Drawing Sheets

APPARATUS FOR SOLDER REMOVAL

This is a continuation of co-pending application Ser. No. 708,044, filed on Mar. 4, 1985, now abandoned, which was a continuation of Ser. No. 555,715, filed Nov. 28, 1983, now U.S. Pat. No. 4,541,358.

FIELD OF INVENTION

This invention relates to the provision of solder or other materials onto a printed wiring board or like device and the removal of excess solder therefrom.

BACKGROUND OF THE INVENTION

As described in U.S. Pat. No. 4,315,042 issued to Donald J. Sprigarelli on Feb. 9, 1982, incorporated herein by reference and assigned to the assignee hereof, there have been several techniques of "solder leveling" which have been developed for obtaining uniformly thick coatings of solder, on the order of 0.0003 to 0.0006 inches, on parts such as printed wiring boards. As noted in this patent, centrifugal forces have been utilized to remove excess solder. A second technique is to use hot oil jets with the hot oil being projected onto the surfaces of the part which has been immersed in molten solder to remove the excess solder in a controlled fashion. Hot air has also been utilized to blow off excess solder. As noted in this patent there are various problems with the above-mentioned techniques, whereas the above-mentioned patent describes a simplified method and apparatus for solder leveling. In the Spigarelli patent the method of solder leveling described involves the maintenance of a zone of hot saturated inert vapor at the temperature of molten solder above a molten bath of solder. A part to be treated is then moved through the vapor at a rate such that it will become uniformly heated to temperatures approaching that of molten solder prior to immersion therein. After initial heating the part is immersed in the molten solder and is withdrawn from the molten solder through the saturated vapor to the ambient atmosphere. While withdrawing the part, streams of hot high density fluid are projected onto the surfaces of the part in directions opposite to the direction of withdrawal to sweep the surfaces of the excess solder. In this patent the part is vertically lowered through the hot saturated inert vapor into a solder pot and is then removed vertically. While this technique works adequately in a large variety of situations, solder sag can occur due to the vertical orientation of the board as it is withdrawn from the solder pot. While solder sag may not inherently present problems in the electrical operation of the board, solder sag is oftentimes unsightly.

Moreover, the solder removal technique in the aforementioned patent describes movement of the board in a vertical direction which, for production line purposes, requires right angle changes in direction of the board for presolder and postsolder processing. This change in direction of the flow of the product requires complicated mechanical repositioning apparatus and is thus somewhat undesirable for high volume production lines.

Additionally, the Spigarelli patent describes fluid jets angled 15°–40° with respect to the board surface to give a glancing flow for solder removal. While these angles work satisfactory in most instances, clearing of "thru-holes" or "via holes" in the board is an occasional problem. Moreover, while this patent specifies pressures of 5–40 lbs. per square inch, the energy delivered by the liquid stream depends on the nozzle dimensions and flow rate. While acceptable leveling occurs at the above pressures, a maximally efficient system requires analysis of the energy delivered to the board. Finally, for vertical board transport, the solder films on either side of the board are equal in thickness which makes differential thickness control difficult.

SUMMARY OF THE INVENTION

While the subject technique utilizes the basic concept of the above-mentioned Spigarelli patent in that dual phases of a heat transfer fluid, liquid and vapor, are utilized to effectuate both process heating and solder leveling, it has been found that nozzle angle and energy delivered by the nozzle flow to the board are critical to efficient solder removal. It has also been found that a near horizontal board transport into and out of the vapor chamber presents the possibility of not only producing a system more compatible with in-line processing but also one in which solder sag is minimized and one in which hole clearing is readily accomplished.

More specifically, it has been found that by maintaining the flow from one of the nozzles near normal to the board while maintaining the other of the nozzles at a slight angle to the board, hole clearing is rapidly and repeatably accomplished. Additionally it has been found that effective solder removal requires that the energy delivered to the board be above a newly empirically found threshold. It has been found that jet streams delivering energy below this threshold do not provide adequate hole clearing. This threshold is dependent upon nozzle flow, that is to say, pounds of fluid delivered to the board surface per second per lineal inch of nozzle aperature for a given liquid density and temperature and a given hole aspect ratio, with the threshold being determined empirically by inspection of the percent of holes cleared. It is thus the operation of the solder leveling nozzles above a predetermined energy threshold which permits hole clearance in a maximally efficient manner. From experimental evidence, this threshold is fairly sharply defined such that solder removal efficiency for hole clearing increases to a level exceeding 99% from a plateau region where 80 to 95% clearing is the rule. This level of clearance (exceeding 99%, usually 100%) is essential to the commercial viability of solder leveling. Inspection, criteria and later manufacturing processes require 100% hole clearance on all boards.

It will be appreciated that in the near-horizontal transport of a board the vapor level in the chamber must be precisely set. More particularly it will be appreciated that a completely horizontal system would be impossible without complicated vapor seals. The subject system provides vapor sealing through the utilization of a cooled chamber throat which is angled upwardly and extends above the level of the vapor maintained in the chamber. The more horizontal that the transport system can be made, the less will be the solder sag. Additionally the horizontal transport system provides the opportunity for more precise hole clearing with, in a preferred embodiment, the upper nozzle providing a jet stream at or near normal to the board ad the lower nozzle providing an angled stream which lower stream is angled against board withdrawal.

As to the advantages of the near-horizontal transport system, these advantages are achieved by providing a vapor-filled chamber with an angled throat into which the board to be coated is introduced. The throat contains a transport system and a carrier for the board which transports the board between the throat and a specially designed recirculating solder pot which has a throat in-line with the plane of the transport system. The solder pot, in one embodiment, is of a recirculating design with a sloping passage for its throat, in which as the board enters, solder spills over a weir into a lower reservoir from whence it is pumped through a centrifugal pump back up into a standpipe which charges the sloping passage. Solder is added to the pot, in one embodiment, through a drop tube, the lower end of which is immersed in the solder in the lowest portion of the reservoir. This provides a unique vapor seal so that the solder pot may be recharged during operation. The drop tube also provides means for determining the level of the solder in the pot.

In one embodiment the throat for the chamber is water cooled to provide for vapor containment. This water cooled throat forms one of three cooling zones which respectively provide for vapor containment, vapor leveling, and vapor condensation.

Solder leveling is accomplished with nozzles positioned in the vapor filled chamber to either side of the board transport system between the solder pot and throat of the chamber. The nozzles project streams of hot liquid maintained above the solder melting temperature towards opposing sides of the board. The perpendicular distance from the board to the nozzle, i.e. nozzle offset, is adjustable, as is nozzle angle. Nozzle angle is adjustable by rotation of a sector to which each nozzle is secured. In one embodiment the pivot point for each sector is such that the impact angle of the stream on the board is adjusted about an axis passing through this pivot point. The sector is provided with a series of teeth or slots at its curved outer periphery to lock the nozzle to a predetermined position by virtue of the cooperation of one of the slots with a spring loaded detent bar. This makes the slot angle adjustable to the extent of the angle subtended by the sector. Further adjustment is achieved through a variation in the attachment mechanism of the nozzle to the sector. In one embodiment this attachment is accomplished by a bar which extends from the pivot point of the nozzle to a point at the periphery of the sector which carries the teeth or slots mentioned above. This bar may be secured either at one side of the sector or at the other so that the initial angle of the nozzle with respect to the sector may be varied between at least two positions prior to fine adjustment accomplished by the rotation of the sector itself.

In a further embodiment a spring loaded carrier is utilized for the transport of printed wiring boards, with the spring action providing ready loading and unloading of the unfinished and finished boards. In one embodiment the spring loaded carrier comprises a three sided frame, with the fourth side being completed by a transverse member slidable within the opposing sides of the frame. The board is inserted into the frame which has lips to retain the board. The slidable member is then urged towards its opposing side by a U-shaped leaf spring which presses the sliding member against the top board edge.

BRIEF DESCRIPTION OF THE DRAWINGS

These and other features of the subject invention will be better understood in connection with the detailed description taken in conjunction with the drawings of which.

DETAILED DESCRIPTION

Figure 1:
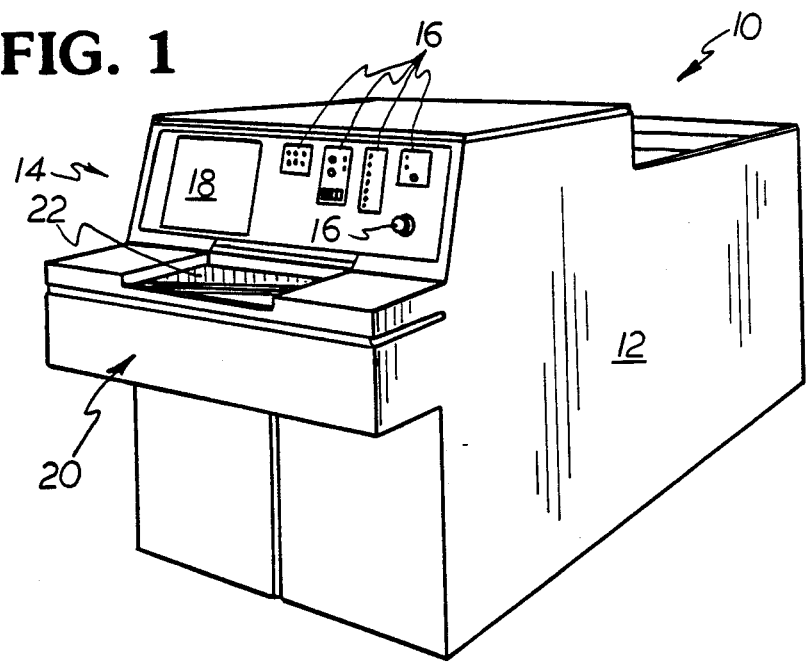
FIG. 1 is an isometric view of apparatus for solder coating an article, illustrating the slanted near-horizontal throat for the vapor chamber therein.

Referring now to FIG. 1, a vapor phase soldering unit 10 is illustrated as having a cabinet 12 and a console 14 with various controls 16 and a display or monitor 18. Cabinet 12 is provided with a forward projection 20 having a loading slot or aperature 22 into which a printed wiring board is inserted prior to solder coating and out of which the solder-leveled board is extracted after the solder coating and leveling process is performed within the unit.

Figure 2:
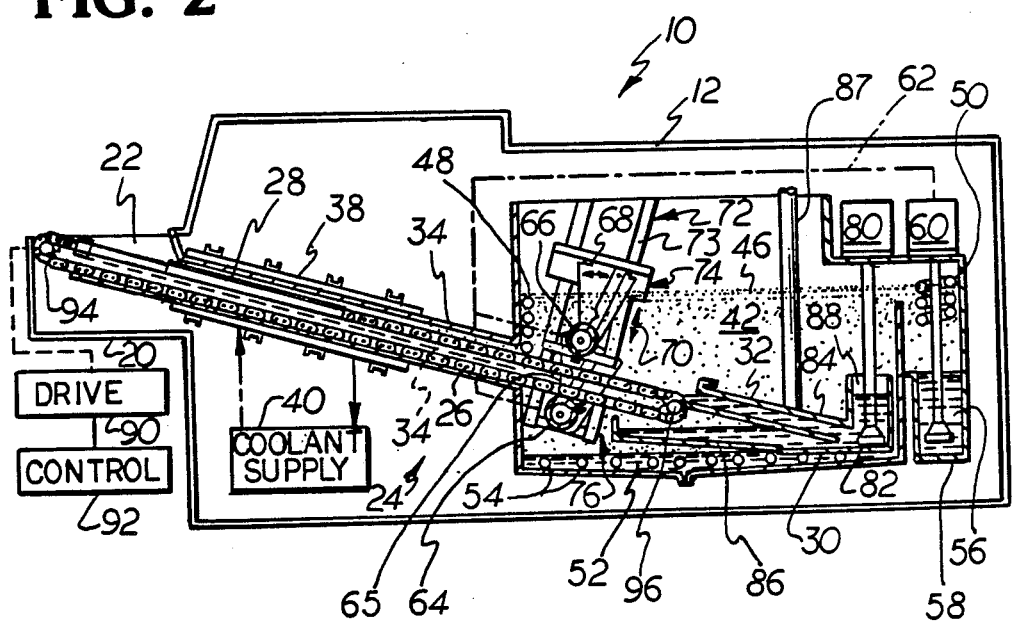
FIG. 2 is a diagrammatic and sectional view of the apparatus of FIG. 1 showing a near-horizontal transport system, the vapor chamber, recirculating solder pot, adjustable nozzles for solder removal, and throat cooling means for maintaining the vapor within the chamber and throat therefor.

Referring now to FIG. 2, unit 10 is diagrammatically described in which a near-horizontal transport system 24 is shown to include a chain drive 26 to which is secured a frame 28 which carries the printed wiring board and moves in the direction of double ended arrow 30 so as to move the board from loading slot 22 into and out of a recirculating solder pot 30 which has a throat 32 aligned with the direction of the transport system. Throat 32 is spaced from a throat 34 which runs from a vapor chamber 36 to loading slot 22.

Throat 34 has a liquid cooled jacket 38 disposed about it to which coolant is supplied from a coolant supply 40. In one embodiment the coolant is water. The purpose of the water-filled jacket is to prevent vapor generally illustrated at 42 from exiting chamber 36 via throat 34.

Vapor 42 is maintained at the level indicated by dotted line 46 by condensation or cooling coils 48 and 50, the top coil of which establishes the level of hot high-density saturated inert vapor within chamber 36. Vapor is generated from material 52, normally Fluorinert FC- 70, which is heated by coils 54 at the bottom of chamber 36 to a temperature above the melting point of solder. Vapor which reaches the level of cooling coils 48 and 50 is condensed and returned respectively to the bottom of chamber 36 or to the bottom of a subdivided chamber 56 which is provided with heating coils 58 at the bottom thereof. These coils heat the condensed vapor to a temperature of 390° F. to 415° F. in one embodiment. A pump 60 is provided to pump the condensed vapor in liquid form via line 62 to nozzles 64 and 66 mounted astride the path of the near-horizontal transport system with the nozzles angled in accordance with the orientation of the sectors 65 and 68 to which they are attached. The temperature of the liquid is maintained above the melting point of the solder. Sectors 65 and 68 are adjustable in the direction indicated by double ended arrow 70 on an assembly generally indicated at 72 which includes a frame 73 and carriages 74 and 76 translatable on the frame, with the carriages carrying the respective sectors. The translation of the carriages on the frame serves to vary the distance between the pivot points of the nozzles and the plane of the near-horizontal transport system.

It is a finding of this invention that the greatest efficiency in the removal of solder from holes in the printed wiring board is achieved when the top nozzle is angled at or near perpendicular to the plane of the printed wiring board and thus substantially perpendicular to the near-horizontal transport system plane, whereas the bottom nozzle is slightly angled towards the solder pot as indicated as much as 25° from the perpendicular to the face of the printed wiring board. Alternatively, the bottom nozzle is angled at or near perpendicular to the plane of the board, with the top nozzle angled towards the solder pot.

As illustrated, solder pot 30 is a recirculating type solder pot which by virtue of pump 80 and impeller 82 pumps solder generally indicated at 84 up into a standpipe 88 whence it flows out through throat 32 and over the edge of the throat down into a receptacle or reservoir 86, with the leading edge of the throat serving as a weir. Solder is added to solder pot 30 via a feed or drop tube 7. The level of solder in pot 30 can be monitored by monitoring the height of solder in feed tube 87 which extends down to the lowest portion of the reservoir. The removal of solder in coating the product will cause the level in reservoir 86 to drop. Note that the immersion of the feed tube into the molten solder creates a vapor seal.

In operation, after the positioning of a printed wiring board in frame 28 a drive unit 90 under control of a control unit 92 is utilized to drive a sprocket 94 of chain drive 26, with a sprocket 96 acting as an idler sprocket for the chain drive. As such the two chains and respective sprockets constitute parallel drive members.

Figure 3A:
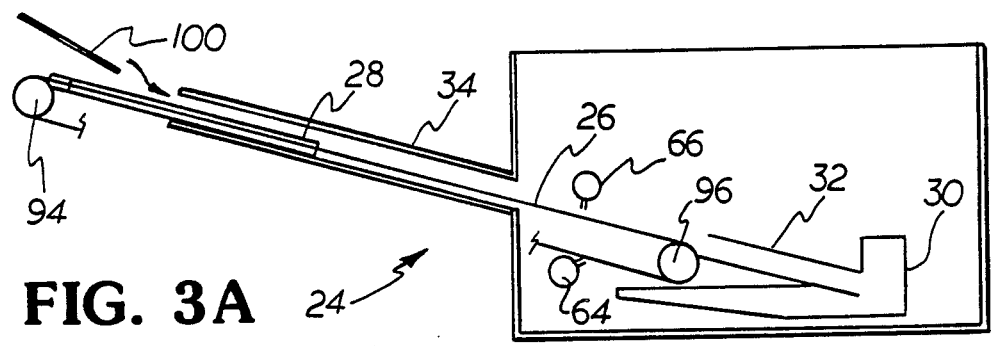
FIGS. 3A-3D are schematic illustrations of the near-horizontal transport of the board through the system of FIG. 2, illustrating board insertion and travel into and out of the solder pot utilized in the apparatus of FIG. 2.
Figure 3B:
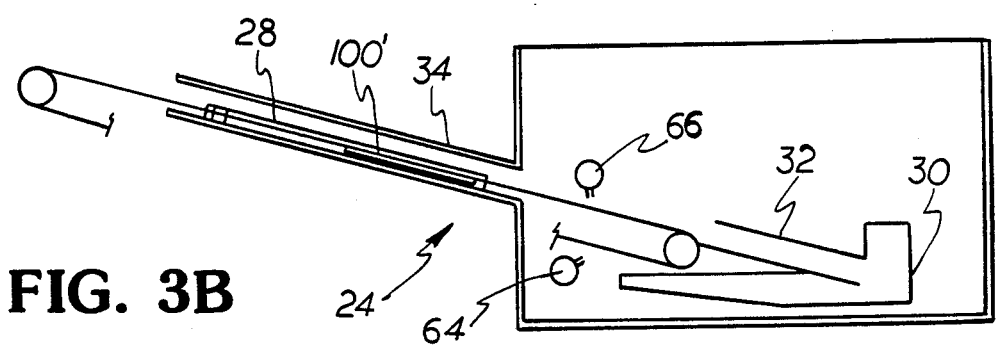
Figure 3C:
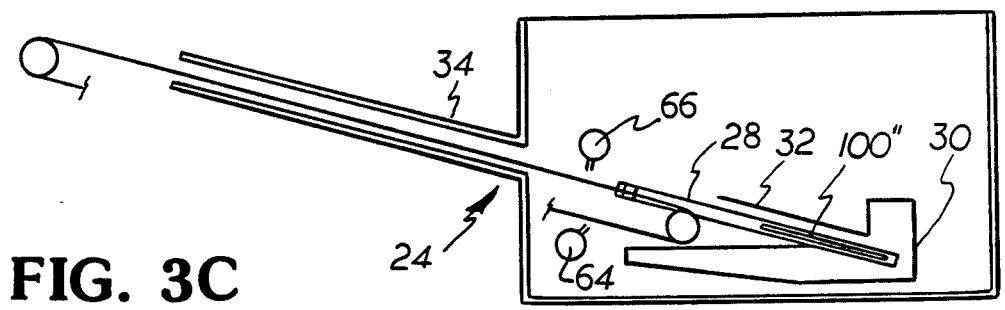
Figure 3D:
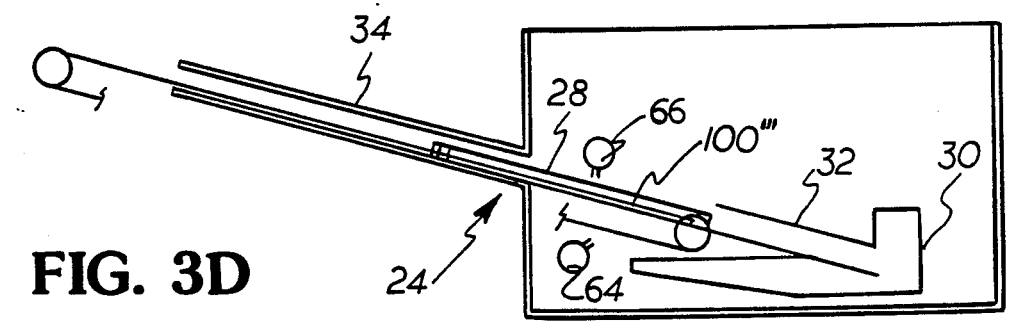

The operation is diagrammatically illustrated in FIGS. 3A-3D in which in FIG. 3A a board 100 is mounted to frame 28. As illustrated in FIG. 3B, the board at position 100' travels down throat 34 and traverses the space between throat 34 and throat 32 until such time as the board 100 is immersed in solder in throat 32. As illustrated at 100", the board is positioned in the solder pot 30 in throat 32 for a predetermined dwell time, usually on the order of 2-5 seconds, and is then withdrawn as illustrated at 100''' via the actuation of the near-horizontal transport system.

Figure 4:
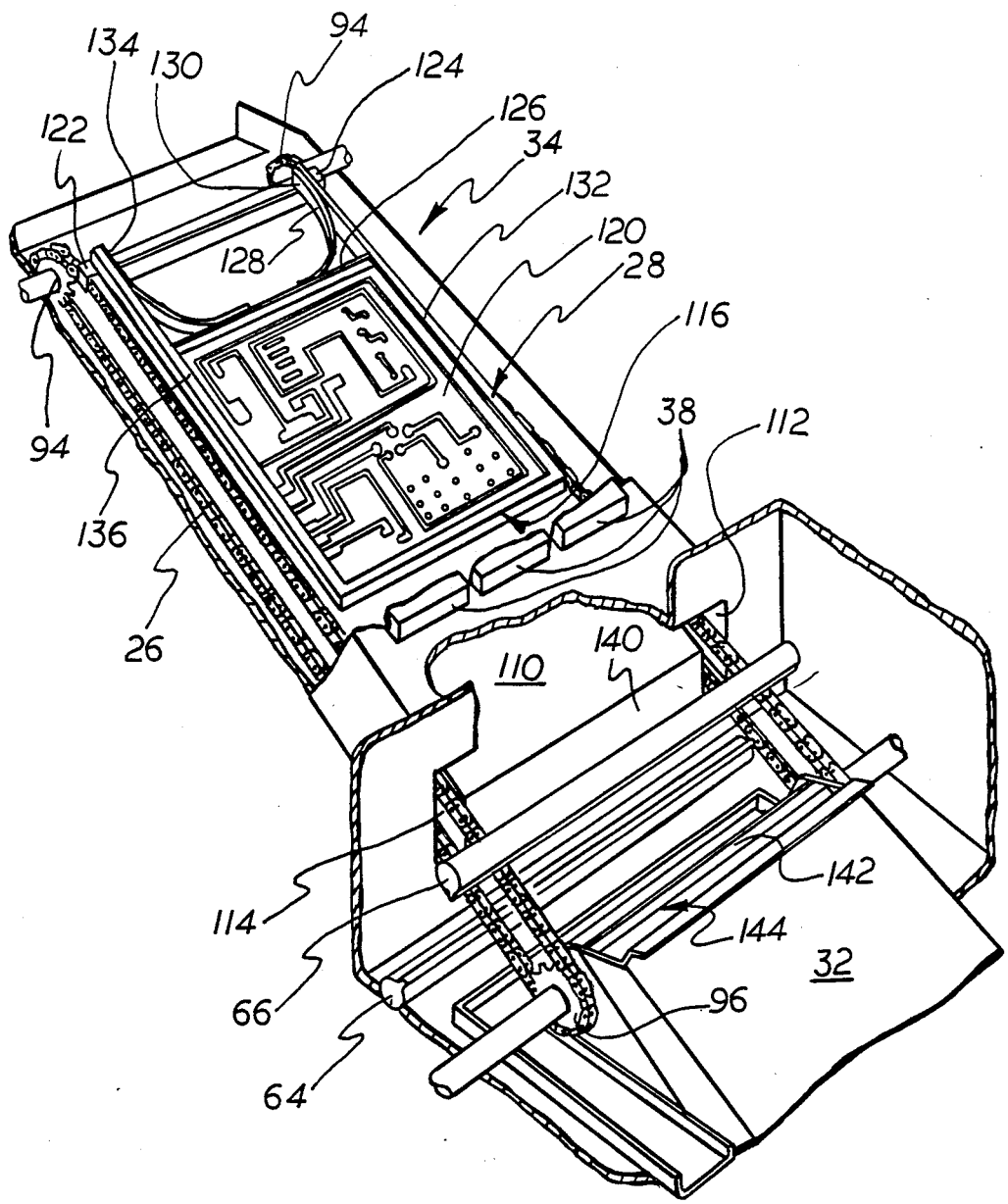
FIG. 4 is a diagrammatic view of the near-horizontal transport system of FIG. 2 illustrating a spring loaded frame carrier for a circuit board to be coated, also illustrating the chain drive transport and the opposition of the solder pot throat to the throat for the chamber.

The near-horizontal transport system described is set forth in more detail in FIG. 4 in which like apparatus of FIGS. 2 and 4 carry like reference characters. Here it can be seen that throat 34 includes a flat bottom portion 110 which supports frame 28 as it moves downwardly. Throat 34 also includes channels 112 and 114 on either side of bottom portion 110 to accommodate chain drive 26. As illustrated, the leading edge 116 of frame 28 rests on the flat bottom portion which supports not only the frame but the printed wiring board, here illustrated at 120 which is carried within the frame. The back of the frame is joined at points 122 and 124 to chain 26, with frame 28 being provided with a movable transverse member 126 which is urged in a downward direction by leaf spring 128 which is joined at one end 130 to side member 132 of frame 28. The other end 134 is demountably secured to frame side member 136 at the end thereof to permit removal of the transverse member 126 for insertion of a printed wiring board into the frame. In general, the side and bottom members of the frame contain grooves for the holding of board 120 so that board 120 is secured therein.

In operation, frame 28 and board 120 are cantilevered over the leading edge 140 of bottom portion 110 between nozzles 64 and 66, which as can be seen are elongated tranverse to the direction of the near-horizontal transport system. The space between leading edge 140 and edge 142 of throat 32 is made less than the length of the frame. The plane of bottom portion 144 of throat 32 is the same as the plane occupied by bottom portion 110 of throat 34, although this need not be the case, with throat 32 straddling this plane. It will be appreciated that the frame 28 could in alternative embodiments be guided by slides or rollers in transiting between edge 140 and edge 142.

Figure 5:
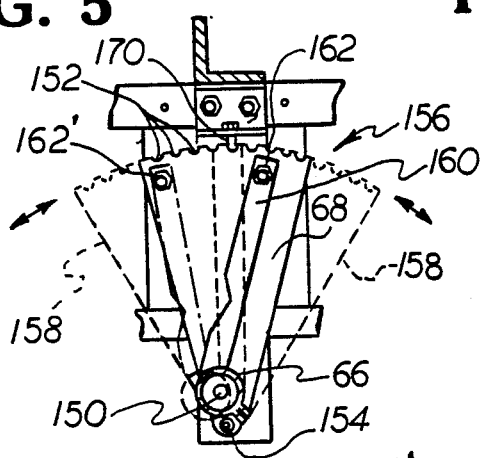
FIG. 5 is a side view of a sector-mounted nozzle forming the upper nozzle of FIG. 2.
Figure 6:
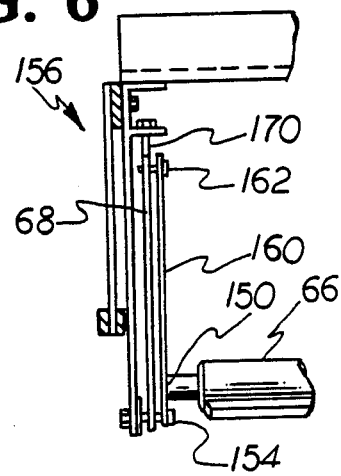
FIG. 6 is a front view of a portion of the nozzle and sector of FIG. 5.
Figure 7:
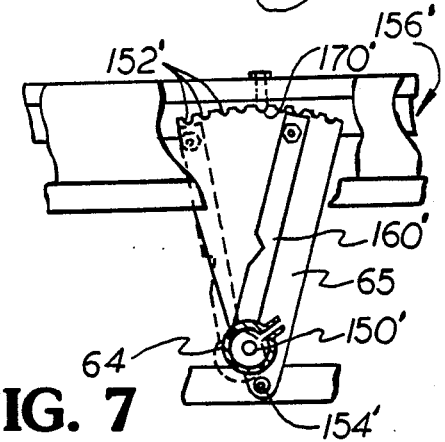
FIG. 7 is a side view of the lower nozzle for use in the apparatus of FIG. 2 showing a sector-carried nozzle.
Figure 8:
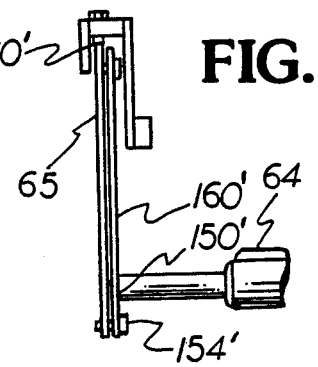
FIG. 8 is a front view of a portion of the nozzle and sector of FIG. 7.
Figure 9:
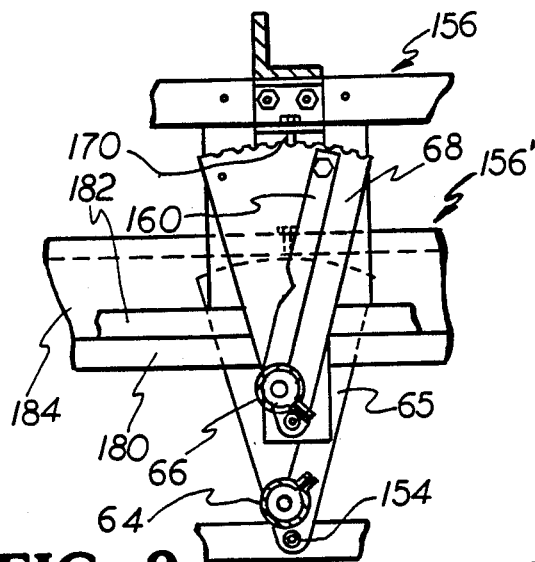
FIG. 9 is a side and diagrammatic view of the combined mounting of the nozzles and sectors of FIGS. 5 and 7.
Figure 10:
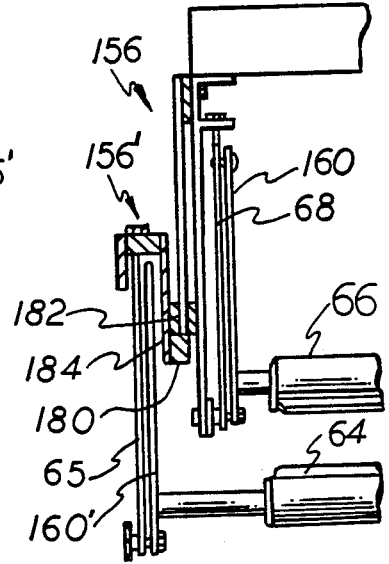
FIG. 10 is a front view of a portion of the nozzles and sectors of FIG. 9.

Referring now to FIGS. 5 and 6, top nozzle 66 is shown rotatable about an axis passsing through point 150 which is on sector 68, with sector 68 being provided with notches, slots or teeth 152 at its periphery. Sector 68 is pivoted at point 154 on a carriage generally indicated at 156 as illustrated by dotted line 158. This carriage corresponds to carriage 74 of FIG. 2. Carriage 156 is mounted for translation of the frame portion of assembly 72 of FIG. 2 to provide for a predetermined nozzle offset from the path of the printed wiring board. Nozzle 66 is oriented on sector 68 via positioning bar 160 which is attached at one end to the periphery of sector 68 at either of two points 162 or 162' depending on the initial angle desired for nozzle 66. The other end of the bar is secured to the end of the corresponding nozzle and pivots on the sector about pivot point 150 such that the nozzle pivots relative to the sector with the pivoting of the bar. Carriage 156 carries a detent member 170 which cooperates with slots or teeth 152 to releasably lock sector 68 into a predetermined position. Referring to FIG. 6 the pivot points 150 and 154 while shown offset may be made to coincide for easy adjustment of nozzle 66. Referring to FIGS. 7 and 8 the bottom nozzle 64 is positioned in the same manner as top nozzle 66 in that it is pivoted about a point 150' on sector 65, with a bar 160' determining the initial angle of this nozzle vis-a-vis sector 65. Detent 170' communicates with slots 152' in the same manner as described in connection with FIGS. 5 and 6. Here carriage 156' corresponds to carriage 76 of FIG. 2. Referring to FIGS. 9 and 10, nozzles 64 and 66 are mounted in spaced adjacency by virtue of the coaction of portions 180 and 182 of their respective carriages 156 and 156'. This spacing can be preadjusted by the movement of butting portion 180 along extension 184 of carriage 156', with the angular orientation of the nozzles being adjusted as described above.

It has been found, as mentioned above, that the clearing of solder from the holes in the printed wiring boards is accomplished more readily when one of the two nozzles projects a stream at or near normal to the board, whereas the other nozzle projects a stream slightly off this normal in a direction opposite to the removal direction of the board. In one embodiment, the spacing between the nozzle tip and the board for each of the nozzles is on the order of $\frac{1}{4}-\frac{1}{2}$ inches whereas the angle of the non-normal nozzle is on the order of 25° with respect to the normal to the board.

The opportunity to place the nozzle projecting a stream at or near normal to the board above or below the plane of the board provides an ability to regulate the thickness of solder deposit placed on the surfaces. Solder thickness tends to be heavier on the lower surface of the board where surface tension and gravity counter each other. On the top surface, surface tension and gravity work together to reduce the thickness of deposit. Thus, it is a feature of the near-horizontal transport system that the solder thickness on the bottom side of the board is greater than the thickness on the top side of the board and that this thickness can in part be controlled by the angle of the nozzles involved. For instance, for a top nozzle perpendicular to the board and a bottom nozzle at 25° with respect to the normal, almost all of the solder is removed from the top board surface whereas the thickness of the solder on the bottom board surface is on the order of 0.0004 inches. It can therefore be seen that there is a differential in thickness of the solder initially deposited on the board and that this thickness can be even further controlled by adjustment of the nozzles. On the other hand, with the bottom nozzle normal to the board and the top nozzle at 25° the thicknesses on top and bottom can be made more nearly the same.

It has also been found that until the energy of the jet stream delivered by the nozzles exceeds a predetermined level, solder leveling is uneven and sometimes without effect. For a given set of conditions, this maximally efficient leveling occurs above a predetermined flow rate measured in terms of pounds of material delivered to the board surface per second per lineal inch of nozzle aperature. For a nozzle of 7 inches in length and an inert fluid of specific gravity 1.6 at 410° F. such as Fluorinert FC-70, the flow rate is adjusted to be above a threshold of 0.2228 lb./sec-in, computed as follows: $Q_{TOT}=27$ in$^3$/sec, for a 7 inch nozzle (experimental data), $Q_{in}=27$ in$^3$/sec-7 in=3.857 in$^3$/sec-in, 0.036 lb/in$^3$ H$_2$O density×1.6 sp.gr. FC-70×3.857 in$^3$/sec-in=0.2228 lb/sec-in=$M_i$, i.e. the mass$_{in}$ flow rate necessary to reliably produce 100% hole clearance for aspect ratio 2 holes, e.g. holes which are twice as deep as their diameters.

For each solder leveling system, while theoretical flow rate calculations yield unacceptable hole clearing results, it has been found that there exists a flow rate or energy level which results in reliable greater than 99 percent hole clearing and that this can be determined empirically by increasing the flow rate and corresponding energy level until greater than 99% hole clearing is achieved.

Figure 11:
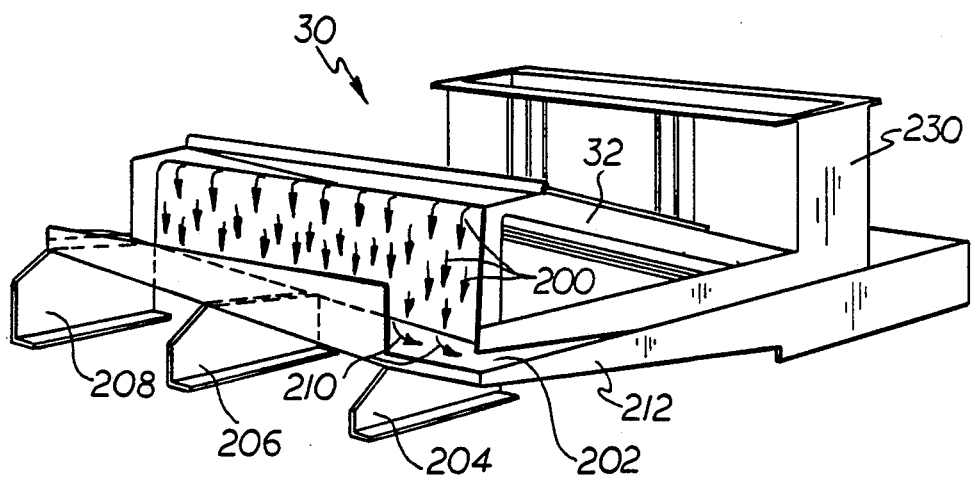
FIG. 11 is an isometric view of the solder pot for use in the system of FIG. 2.
Figure 12:
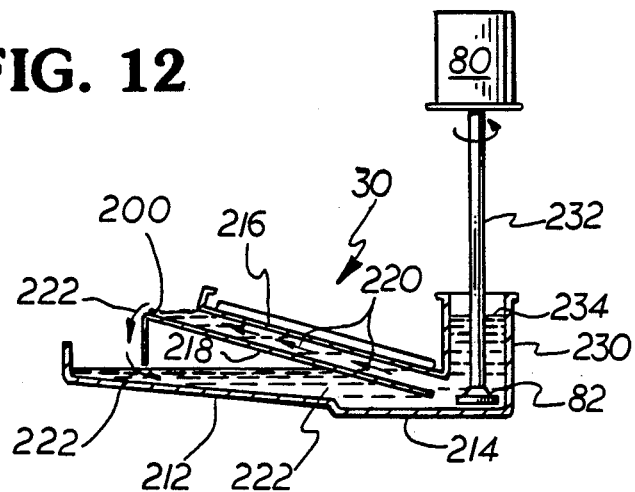
FIG. 12 is a sectional and schematic view of the solder pot of FIG. 11, illustrating the recirculation of the solder within the solder pot.

Referring now to FIGS. 11 and 12, a diagrammatic view of solder pot 30 is illustrated in which throat 32 is shown as illustrated, with edge 200 forming the aforementioned weir. The solder pot in general includes a chamber with a slanted gutter 202 supported on struts 204, 206 and 208 as illustrated, such that the solder dumped over weir 200 moves in the direction of arrow 210 towards the bottom right hand side. The bottom 212 of solder pot 30 is also angled downwardly and rearwardly to a reservoir 214 into which is positioned impeller 82 of pump 80. Throat 32 is here illustrated as including top and bottom walls 216 and 218, with edge 200 of wall 218 forming the aforementioned weir.

In operation, solder is pumped by impeller 82 up throat 32 as illustrated by arrows 220, with the return illustrated by arrows 222. As illustrated in FIGS. 11 and 12 it will be appreciated that solder pot 30 has an additional throat 230 which serves as a standpipe and through which the shaft 232 of motor 80 and impeller 82 project. In one embodiment, the level of the solder in throat 230 is maintained by the standpipe through which additional solder is added to the solder pot, which standpipe regulates the level 234 of the solder. In the FIG. 2 embodiment, the aforementioned drop tube is used to add solder.

Having above indicated a preferred embodiment of the present invention, it will occur to those skilled in the art that modifications and alternatives can be practiced within the spirit of the invention. It is accordingly intended to define the scope of the invention only as indicated in the following claims.

What is claimed is:

1. A vapor phase solder system for soldering of a workpiece comprising
   a vessel for containing an electronic liquid,
   heater means for heating the contained electronic liquid to generate a zone of saturated vapor,
   a first inclined throat means communicating with said vessel,
   solder pot means within said vessel for containing molten solder, said solder pot means including
      reservoir means for containing molten solder,
      second throat means aligned with said first throat means, said second throat means communicating at one end with molten solder contained in said reservoir means and communicating at the other end with the saturated vapor,
      means for pumping molten solder contained in said reservoir means through said second throat means, said reservoir means being selectively configured to receive molten solder discharged from said second throat means, and
   conveyor means for carrying work product through said first throat means, through the saturated vapor and into said second throat means whereby the work product will become immersed in the molten solder contained within said second throat means.

2. A vapor phase system according to claim 1, wherein said solder pot means further comprises vertical stand pipe means.

* * * * *